US012581701B2

(12) United States Patent
Rassel et al.

(10) Patent No.: US 12,581,701 B2
(45) Date of Patent: Mar. 17, 2026

(54) DEVICE WITH DUAL ISOLATION STRUCTURE

(71) Applicant: GLOBALFOUNDRIES U.S. Inc., Malta, NY (US)

(72) Inventors: Richard J. Rassel, Essex Junction, VT (US); Johnatan A Kantarovsky, South Burlington, VT (US); Zhong-Xiang He, Essex Junction, VT (US); Mark D. Levy, Williston, VT (US); Michel J. Abou-Khalil, Essex Junction, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 727 days.

(21) Appl. No.: 17/504,051

(22) Filed: Oct. 18, 2021

(65) Prior Publication Data

US 2023/0117591 A1    Apr. 20, 2023

(51) Int. Cl.
*H10D 30/47* (2025.01)
*H01L 21/76* (2006.01)
(Continued)

(52) U.S. Cl.
CPC ......... *H10D 62/113* (2025.01); *H10D 30/015* (2025.01); *H10D 30/475* (2025.01);
(Continued)

(58) Field of Classification Search
CPC ........... H01L 29/0642; H01L 29/66462; H01L 29/7786; H01L 29/2003; H01L 29/205;
(Continued)

(56) References Cited

U.S. PATENT DOCUMENTS

2006/0084235 A1* 4/2006 Barr .................. H01L 29/66772
                                                        438/300
2006/0121682 A1* 6/2006 Saxler ................ H10D 30/4732
                                                        438/335
(Continued)

FOREIGN PATENT DOCUMENTS

JP          2012164693          8/2012

OTHER PUBLICATIONS

V. Umansky, M. Heiblum, Chapter 6—MBE growth of high-mobility 2DEG, Editor(s): Mohamed Henini, Molecular Beam Epitaxy, Elsevier, 2013, pp. 121-137, ISBN 9780123878397, https://doi.org/10.1016/B978-0-12-387839-7.00006-3. (Year: 2013).*
(Continued)

*Primary Examiner* — Christine S. Kim
*Assistant Examiner* — Sesha Sairaman Srinivasan
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a semiconductor device with a dual isolation structure and methods of manufacture. The structure includes: a dual isolation structure including semiconductor material; and an active device region including a channel material and a gate metal material over the channel material. The channel material is between the dual isolation structure and the gate metal material includes a bottom surface not extending beyond a sidewall of the dual isolation structure.

19 Claims, 7 Drawing Sheets

(51) Int. Cl.

| | |
|---|---|
| *H01L 21/762* | (2006.01) |
| *H10D 30/01* | (2025.01) |
| *H10D 62/10* | (2025.01) |
| *H10D 62/85* | (2025.01) |
| *H10D 62/824* | (2025.01) |
| *H10D 62/854* | (2025.01) |

(52) U.S. Cl.

CPC ....... *H10D 62/824* (2025.01); *H10D 62/8503*
             (2025.01); *H10D 62/854* (2025.01)

(58) Field of Classification Search

CPC ............. H01L 29/207; H01L 21/76232; H01L
             21/7605; H01L 21/76224; H01L 29/0657;
             H10D 62/113; H10D 30/015; H10D
             30/475; H10D 62/824; H10D 62/8503;
             H10D 62/854; H10D 84/406

See application file for complete search history.

(56) References Cited

U.S. PATENT DOCUMENTS

| | | | | |
|---|---|---|---|---|
| 2008/0290371 A1* | 11/2008 | Sheppard | .............. | H01L 21/046 |
| | | | | 257/745 |
| 2010/0233873 A1* | 9/2010 | Anderson | ............ | H10D 30/024 |
| | | | | 257/E21.19 |
| 2013/0099324 A1 | 4/2013 | Huang et al. | | |
| 2015/0249150 A1* | 9/2015 | Yamaguchi | ......... | H01L 29/1029 |
| | | | | 438/172 |
| 2016/0284831 A1* | 9/2016 | Shindome | ........... | H01L 21/2654 |
| 2017/0110548 A1* | 4/2017 | Kawaguchi | .......... | H01L 29/402 |
| 2017/0154988 A1* | 6/2017 | Hurkx | ............... | H10D 30/4755 |
| 2019/0148375 A1* | 5/2019 | Lin | .................... | H10D 84/0177 |
| | | | | 257/394 |
| 2019/0341480 A1* | 11/2019 | Boles | ................... | H10D 62/824 |
| 2020/0395358 A1* | 12/2020 | Radosavljevic | ... | H10D 62/8503 |
| 2021/0143257 A1* | 5/2021 | Huang | ............. | H01L 29/66462 |
| 2021/0265477 A1* | 8/2021 | Lu | .................... | H01L 29/42316 |

OTHER PUBLICATIONS

Li et al., "200 V Enhancement-mode p-GaN HEMTs Fabricated on 200 mm GaN-on-SOI with Trench Isolation for Monolithic Integration", IEEE Electron Device Letters, vol. 38, No. 7, Jul. 2017, 4 pages.

Arulkumaran et al., "Improved device isolation in AlGaN/GaN HEMTs on Si by heavy Kr⁺ Ion implantation", IEEE, 2014, 2 pages.

* cited by examiner

DEVICE WITH DUAL ISOLATION STRUCTURE

FIELD OF THE INVENTION

The present disclosure relates to semiconductor structures and, more particularly, to a semiconductor device with a dual isolation structure and methods of manufacture.

BACKGROUND

A high-electron-mobility transistor (HEMT) is a field-effect transistor incorporating a junction between two materials with different band gaps (i.e. a heterojunction) to form a two dimension electron gas (2DEG) as the channel region. A commonly used material combination is GaAs with AlGaAs, although other materials can be used depending on the application of the device. For example, HEMT devices incorporating gallium nitride (GaN) are known to exhibit high-power performance.

HEMTs may be used in integrated circuits as digital on-off switches or as RF power amplifiers. HEMTs are also able to operate at higher frequencies than ordinary transistors, up to millimeter wave frequencies. In these frequency ranges, the HEMT can be used in high-frequency products such as cellular telephones, satellite television receivers, voltage converters, and radar equipment.

Typical HEMT devices require electrical isolation between devices that incorporate a mesa etch of the heterostructure material to break up and isolate the 2DEG channel between devices. However, a short gate length can overlap a mesa etch region which creates distortions in the signal (e.g., harmonics) as well as presents challenges for the resist opening (due to topography). In such processes, gate length is limited to approximately 0.2 μm.

SUMMARY

In an aspect of the disclosure, a structure comprises: a dual isolation structure comprising semiconductor material; and an active device region comprising a channel material and a gate metal material over the channel material, the channel material being between the dual isolation structure and the gate metal material comprising a bottom surface not extending beyond a sidewall of the dual isolation structure.

In an aspect of the disclosure, a structure comprises: an active device region comprising a channel material and a gate metal material; a first isolation structure of doped semiconductor material on a first side of the channel material of the active device region; and a second isolation structure of the doped semiconductor material on a second, opposing side of the channel material of the active device region.

In an aspect of the disclosure, a method comprises: forming an active device region comprising a channel material and a gate metal material; forming a first isolation structure of doped semiconductor material on a first side of the channel material of the active device region; and forming a second isolation structure of the doped semiconductor material on a second, opposing side of the channel material of the active device region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a semiconductor device with a dual isolation structure and methods of manufacture. More specifically, the present disclosure relates to a dual isolation structure used with a high-electron-mobility transistor (HEMT) device. In embodiments, the HEMT device may be a GaN HEMT device. Advantageously, the dual isolation structure reduces gate-drain leakage, while also allowing the benefit of a mesa isolation (i.e., strain) without having a short gate length over topography. This structure also provides the benefit of increased yields, compared to conventional HEMT device configurations.

In embodiments, the HEMT device includes a mesa isolation structure which surrounds (e.g., on opposing sides) the HEMT device. The mesa isolation structure may include an isolation implant which acts as a buffer between a mesa etch and the active part of the device. In embodiments, the gate structure may overlap the isolation implant area, e.g., sits on a surface of the mesa isolation structure or is coplanar with the vertical sidewall of the mesa isolation structure, i.e., coplanar with a channel region; however, the gate structure should not overlap the mesa etch. Also, the mesa isolation structure can be coplanar with a horizontal, upper surface of a buffer layer over the channel material. An angled etch into the GaN channel layer can also be filled with dielectric material.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii)

applying a patterned mask on top of the films by photolitho-graphic imaging, and (iii) etching the films selectively to the mask.

Figure 1:
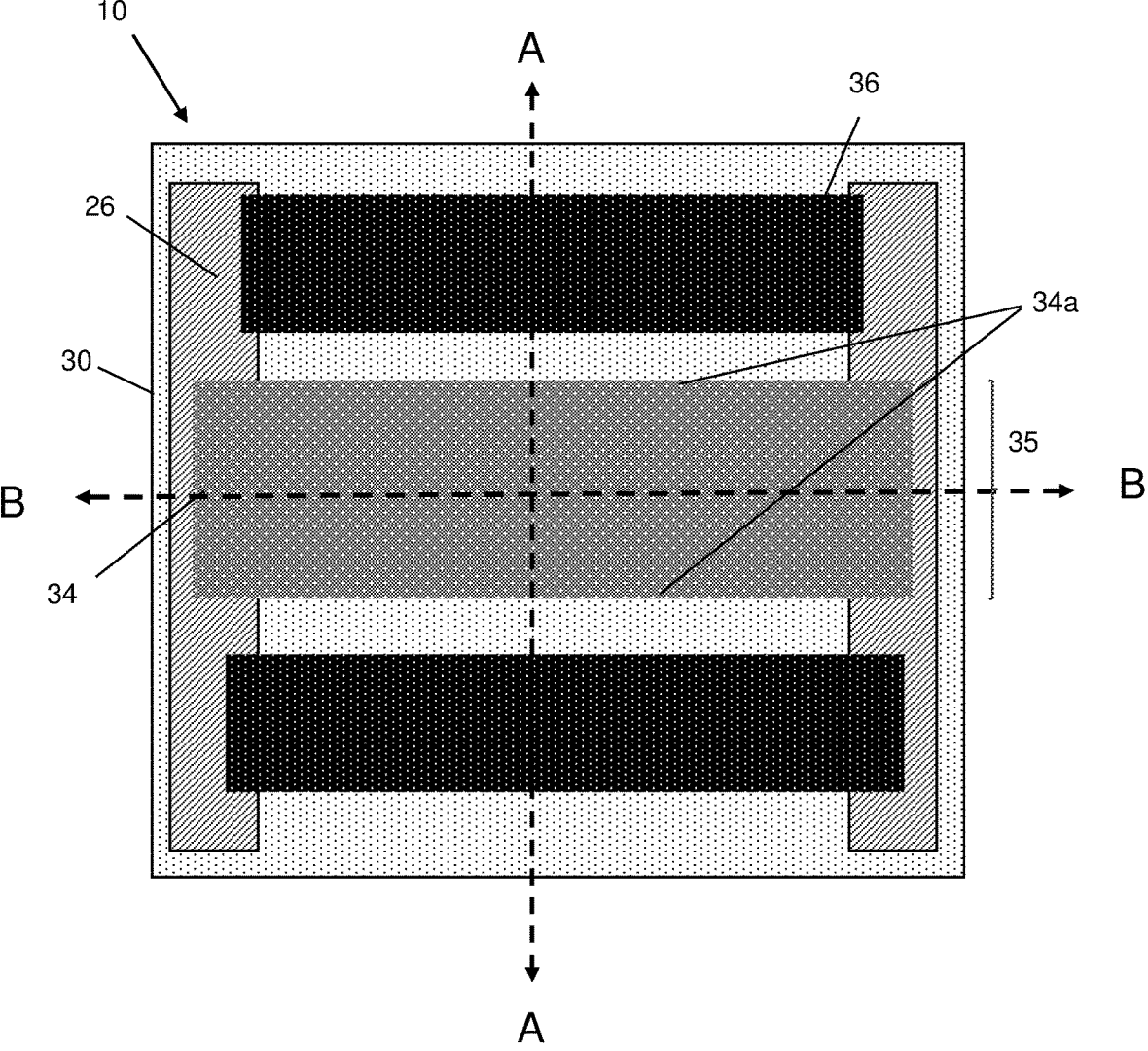
FIG. 1 shows a top view of a gate structure with a dual isolation structure (mesa), amongst other features.

FIG. 1 shows a top view of the device shown in FIGS. 2-7. In particular, FIG. 1 shows a structure 10 comprising dual isolation structures 26 extending on opposing sides of a gate structure 35, e.g., channel material, source/drain regions 36 and gate metal 34. In embodiments, the isolation structures 26 may be absent from a set of opposing sidewalls 34a of the active region of the gate structure 35. Also as shown, the gate metal 34 does not extend beyond an etched edge of the isolation regions 26. Source/drain regions 36 are located adjacent to the active region, e.g., gate structure 35 (with channel material). In embodiments, the source/drain regions 36 may be a raised source and a raised drain formed from, for example, an ohmic metal (e.g., GaN). As should be understood, the source/drain regions 36 also include an ohmic metal contact. The source/drain regions 36 can be formed directly on the channel material as described in further detail.

Figure 2:
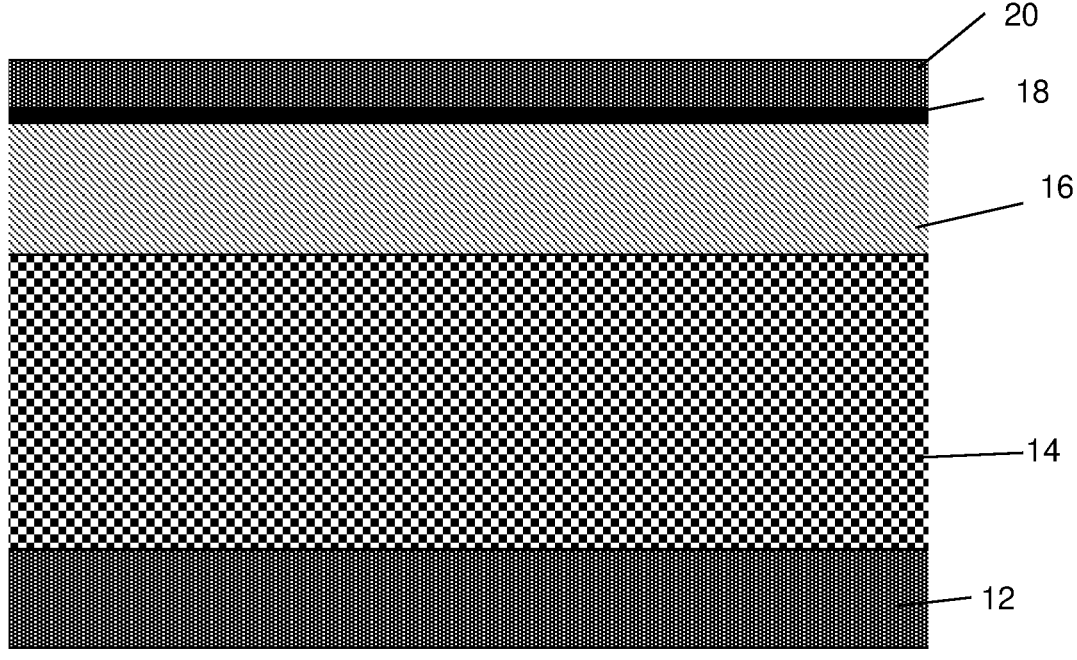
FIG. 2 shows a structure comprising a stack of materials and respective fabrication processes in accordance with aspects of the present disclosure, along line B-B of FIG. 1.

FIGS. 2-6 show fabrication processes and respective structures for building the device shown in FIG. 1, along line B-B. In particular, FIG. 2 shows a structure comprising a stack of materials and respective fabrication processes. In embodiments, the structure includes a buffer layer 14 formed on a handle wafer 12. The handle wafer 12 may be composed of any suitable semiconductor material including, but not limited to, Si, SiGe, SiGeC, SiC, GaAs, InAs, InP, and other III/V or II/VI compound semiconductors. The buffer layer 14 may be a GaN material epitaxially grown on the handle wafer 12. As a more specific and non-limiting illustrative embodiment, the buffer layer 14 may comprise an AlN/AlGaN transition layer, carbon doped GaN layer and a AlGaN barrier layer. In embodiments, an option AlN layer may be provided between the GaN layer and AlGaN barrier layer. The materials of the buffer layer 14 may be deposited using, for example, a Metal-Organic chemical vapor depo-sition (MOCVD) epitaxial growth process deposited to a thickness of about 1 micron or greater.

Still referring to FIG. 2, a channel material 16 may be formed on the buffer layer 14. In embodiments, the channel material 16 may be GaN deposited using any known epi-taxial process to a thickness of 100 nm or more. For example, the channel material 16 may be grown (or depos-ited) using MOCVD or Molecular Beam Epitaxy (MBE), with MOCVD being preferred for GaN. In embodiments, the channel material 16 may also include an optional AlN barrier material layer.

A barrier material 20 may be formed, e.g., deposited, over the channel material 16. The barrier material 20 may be a layer of AlGaN, as an example. The barrier material 20 may be deposited to a thickness of about 5 nm to about 25 nm, with a concentration of about 25% of Al. A two dimensional electron gas (2DEG) layer 18 forms between the barrier material 20 and the channel material 16 due to the difference in bandgaps of the barrier material 20 and the channel material 16.

Figure 3:
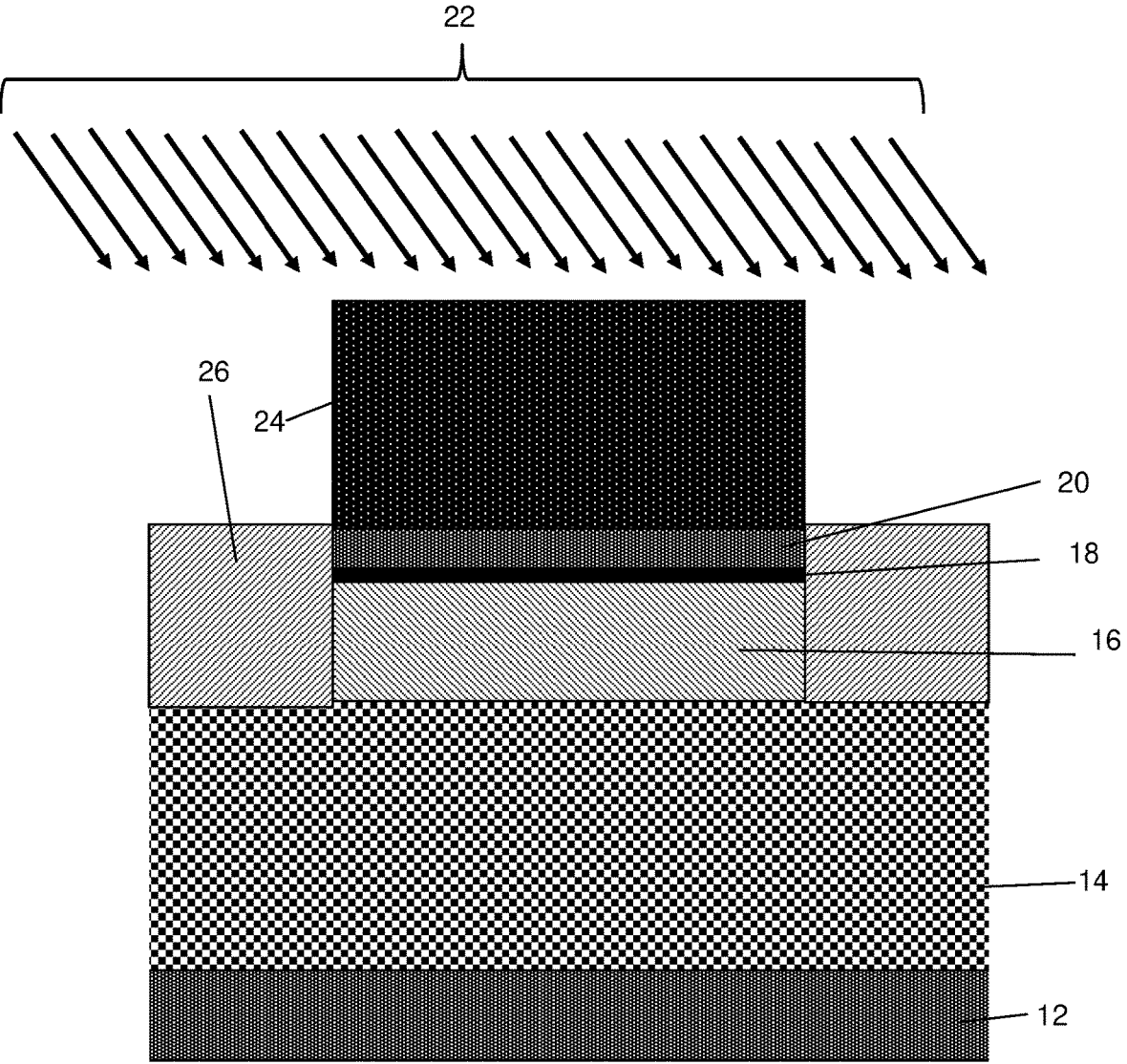
FIG. 3 shows isolation regions, amongst other features, and respective fabrication processes in accordance with aspects of the present disclosure, along line B-B of FIG. 1.

In FIG. 3, the barrier material 20 and the channel material 16 are subjected to an implantation process as shown by arrows 22 to form isolation regions 26 in the barrier material 20 and the channel material 16. In embodiments, the isola-tion regions 26 may be composed of ions of N, Ar, He, or Xe or other ions of an inert or noble implant species, as examples. More specifically, the isolation regions 26 may be formed by introducing a concentration of an inert or noble gas, e.g., N, Ar, He, or Xe or other ions of an inert or noble implant species, in the barrier material 20 and the channel material 16, stopping at the buffer layer 14. The concentra-tion of the implant may be about 1E18 to 1E19, as an illustrative example. As should be understood by those of ordinary skill in the art, the ion implant of the gas will generate defects (e.g., vacancies) in the crystal lattice struc-ture of the barrier material 20 and the channel material 16 and/or an amorphous crystal structure, disrupting the 2DEG induced layer 18, resulting in the isolation regions 26. Also, in this way, the barrier material 20 and the isolation regions 26 will have coplanar surfaces.

Still referring to FIG. 3, in embodiments, to form the isolation regions 26 (e.g., dual isolation structures) a pat-terned implantation mask 24 may be used to define selected areas exposed for the implantations process to form the isolation regions 26. The implantation mask may include a layer of a light-sensitive material, such as an organic pho-toresist, applied by a spin coating process, pre-baked, exposed to light projected through a photomask, baked after exposure, and developed with a chemical developer. The implantation masks have a thickness and stopping power sufficient to block masked areas against receiving a dose of the implanted gas.

Figure 4:
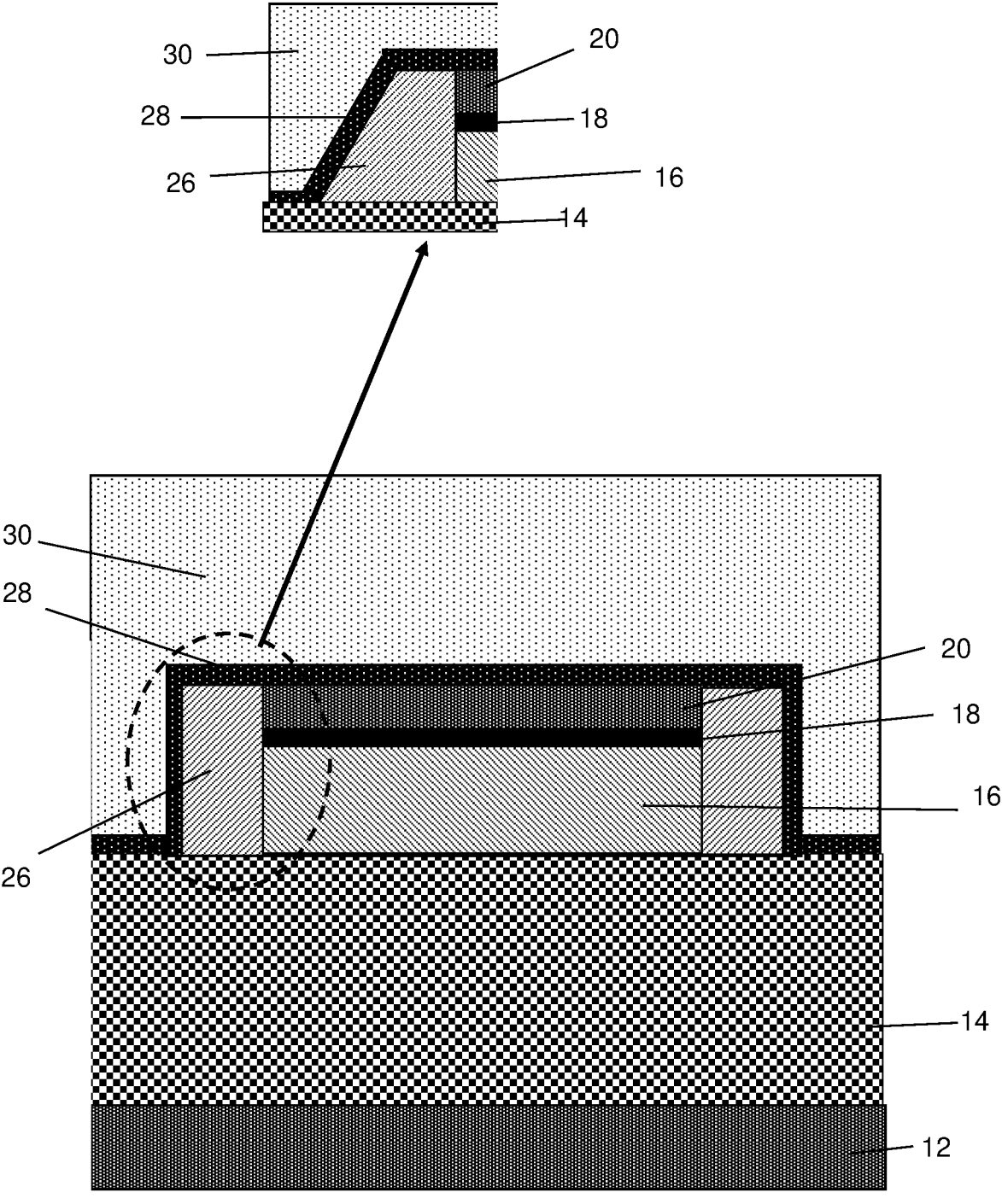
FIG. 4 shows a barrier material and insulator material over the isolation regions, amongst other features, and respective fabrication processes in accordance with aspects of the present disclosure, along line B-B of FIG. 1.

In FIG. 4, the patterned implantation mask is removed by using known stripants, e.g., oxygen ashing, etc. Following the removal of the patterned implantation mask, the isolation regions 26 may be patterned using conventional lithography and etching processes to form a mesa structure comprising isolation structures (also referred to at reference numeral 26). For example, a photoresist layer formed on the barrier material 20 and isolation regions 26 is exposed to energy (light) to form a pattern (opening). An etching process with a selective chemistry, e.g., reactive ion etching (RIE), will be used to transfer the pattern from the photoresist layer to the isolation regions 26 through the openings of the photoresist layer. In embodiments, the etching process can be an angled etch to form an angled or tapered sidewall of the now formed isolation structures 26, e.g., dual isolation structures, as shown in the enlarged view of FIG. 4. In any etching scenario, the layers 16, 18, 20 will have a vertical sidewall; whereas, in the angled etching process, the isolation struc-tures 26 will have an angled sidewall. The isolation struc-tures 26 may remain coplanar with the barrier material 20, and may form an isolation structure on both sides of the channel region, e.g., channel material 16 (in addition to the barrier material 20 and layer 18), of an active device.

Following the photoresist removal by a conventional oxygen ashing process or other known stripants, an encap-sulation layer 28 may be formed over the isolation structures 26, the barrier material 20 and any exposed buffer layer 14. The encapsulation layer 28 may be a dielectric material formed by a chemical vapor deposition (CVD) process to a thickness of about 10 nm to about 100 nm. In optional embodiments, the encapsulation layer 28 may be removed from the buffer layer 14 by a conventional lithography and etching process. An insulator material 30, e.g., oxide, may be formed over the encapsulation layer 28. For example, the insulator material 30 may fill the opening formed by etching of the isolation regions 26. The insulator material 30 may be an interlevel dielectric material, e.g., $SiO_2$, deposited by a CVD process.

Figure 5:
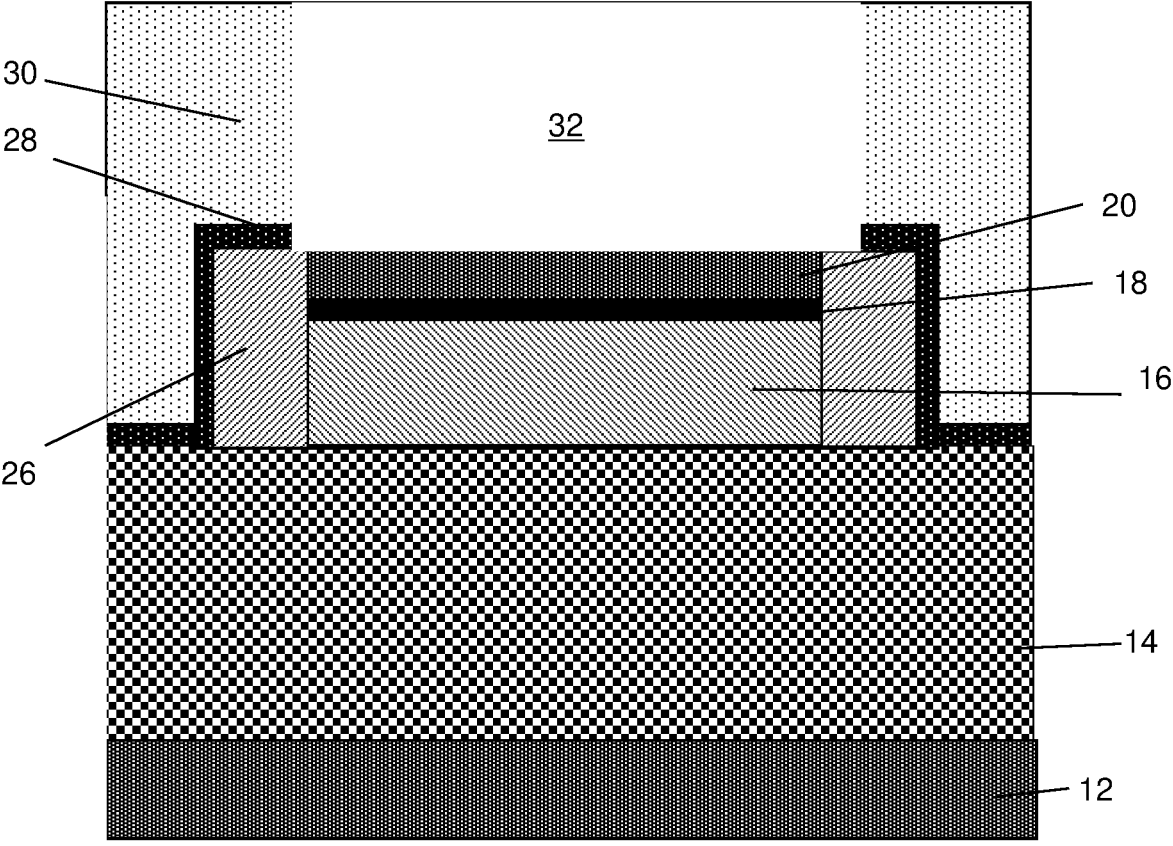
FIG. 5 shows an opening in the insulator material and barrier layer, amongst other features, and respective fabrication processes in accordance with aspects of the present disclosure, along line B-B of FIG. 1.

Referring now to FIG. 5, an opening 32 may be formed in the insulator material 30 and the encapsulation layer 28, exposing the underlying barrier material 20. In embodi-ments, the opening 32 may also partly expose a surface of the isolation structures 26. Alternatively, the opening 32 can be aligned with the vertical sidewalls of the underlying barrier material 20 and channel material 16. The opening 32 preferably does not overlap an etched edge of the isolation structures 26. That is, the opening preferably does not extend beyond the isolation structures 26. The opening 32 may be formed by conventional lithography and etching processes such that no further explanation is required for a complete understanding of the present disclosure.

Figure 6:
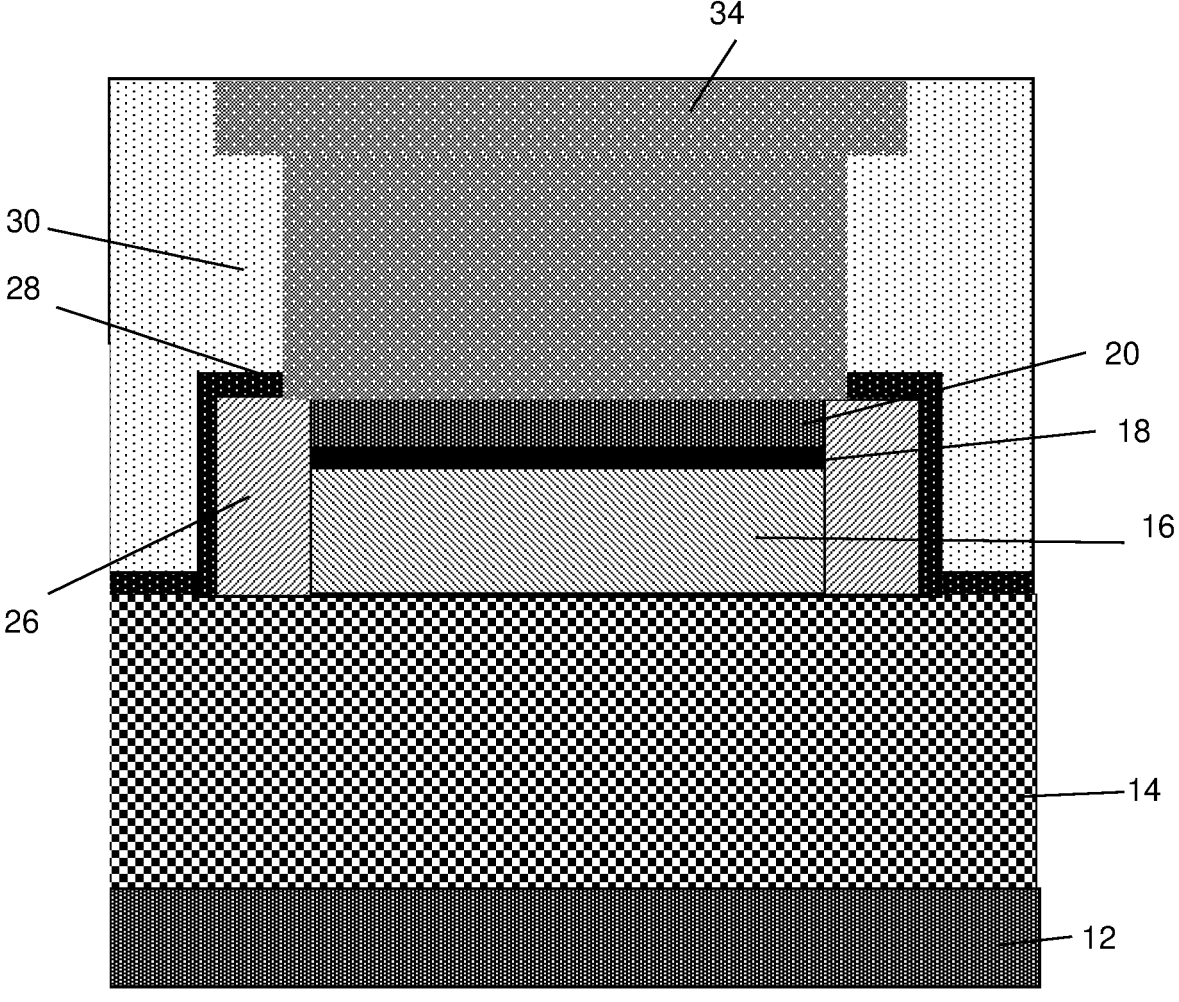
FIG. 6 shows a gate metal formed within the opening, amongst other features, and respective fabrication processes in accordance with aspects of the present disclosure, along line B-B of FIG. 1.

In FIG. 6, a gate metal 34 may be formed within the opening 32 and in contact with the encapsulation layer 28. The gate metal 34 may also overlap onto an upper surface of the exposed isolation structures 26, e.g., mesa isolation structure surrounding the materials 16, 20 and electrically induced layer 18. The opening 32 should prevent the gate metal 34 from overlapping past etched edges of the isolation regions 26. In other words, the bottom surface of the gate material 34 will not extend past a mesa etch. Also, in embodiments, the gate metal 34 may be coplanar with the vertical surface of the barrier layer 20 and channel material 16, depending on the dimensions of the opening 32. Accordingly, distortions in the signal (e.g., harmonics) can now be prevented. Also, the encapsulation layer 28 prevents gate leakage from occurring at the sides of the channel region. Additional insulator material 30 may be formed over any of the gate metal 34, followed by an optional chemical mechanical polishing (CMP) process.

The gate metal 34 may be any appropriate gate metal such as, e.g., TiN, AlTi, W or combinations thereof. The gate metal 34 may be deposited using any conventional deposition process, followed by a patterning process, e.g., lithography and etching process, as is known in the art. An activation anneal process known to those of skill in the art may be used following the deposition of the gate metal. In embodiments, the gate metal may be deposited using a dual damascene or single damascene processes.

Figure 7:
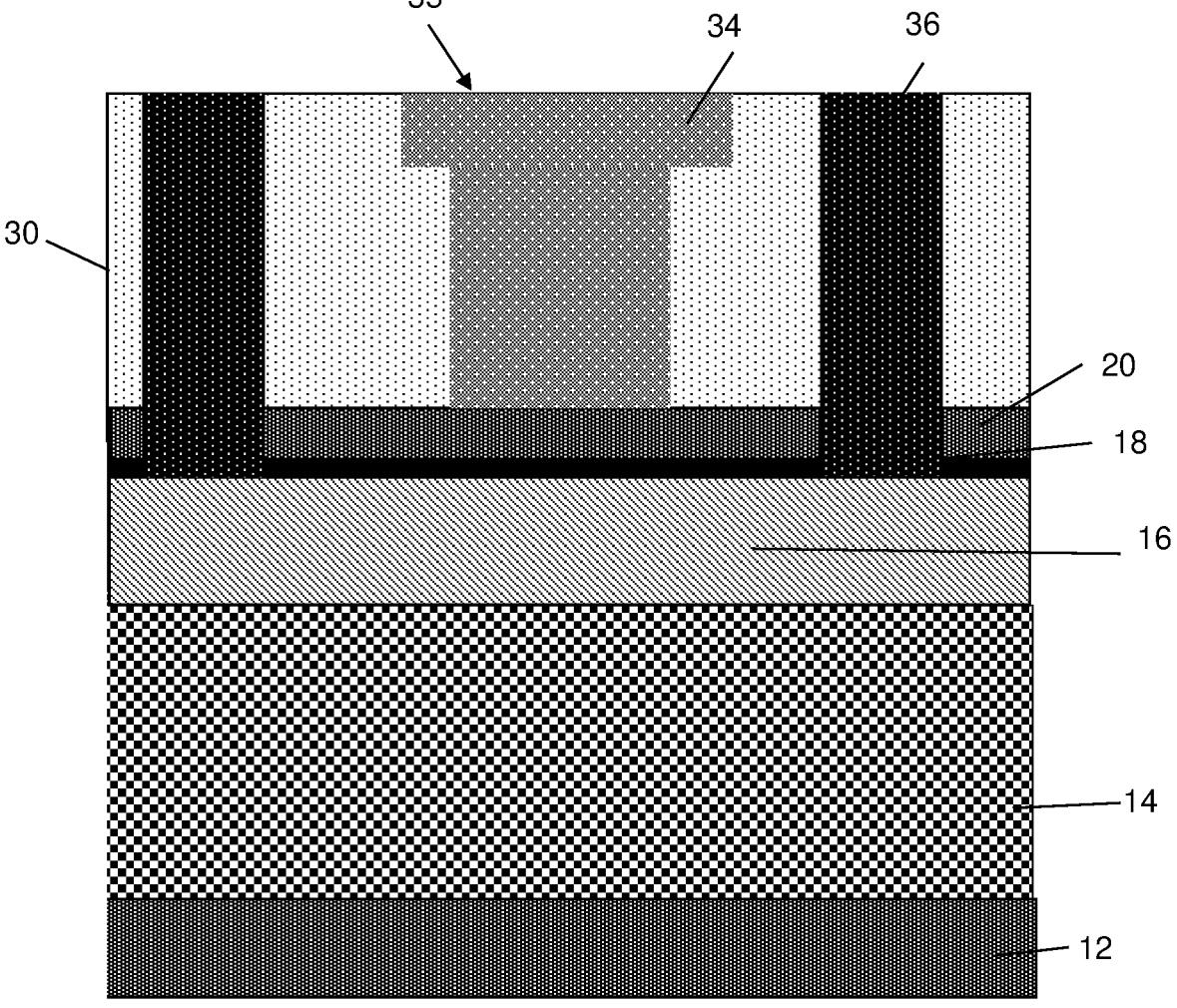
FIG. 7 shows a cross-sectional view of the structure of FIG. 1 along line A-A.

FIG. 7 shows a cross-sectional view of the device of FIG. 1 along line A-A. Source/drain regions 36 are located adjacent to the active region, e.g., gate structure 35 with channel material 16. In embodiments, the source/drain regions 36 may be a raised source and a raised drain formed from, for example, an ohmic metal, (e.g., GaN) using deposition processes known to those of skill in the art such that no further explanation is required for a complete understanding of the present disclosure. As further described herein, the source/drain regions 36 also include an ohmic metal contact. Accordingly, the source and drain regions 36 may represent both the source/drain on adjacent sides of the gate structure 35, in addition to the ohmic metal contacts.

In embodiments, prior to the formation of the source/drain regions 36 and, optionally, deposition of the insulator material 30, an etching process can be performed to expose the underlying channel material 16. The etching process can be a conventional lithography and etching process such that no further explanation is required for a complete understanding of the present disclosure. In this way, the source/drain can be deposited directly on the channel material 16.

The devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a buffer layer above an underlying semiconductor material;
   a dual isolation structure comprising semiconductor material and located over the buffer layer, the dual isolation structure comprises non-vertical, angled outer sidewalls; and
   an active device region comprising a channel and a gate metal material over the channel material, the channel material being between and directly contacting inner sidewalls of the dual isolation structure and under the gate metal material and comprising a bottom surface over the buffer layer and not extending beyond the outer sidewalls of the dual isolation structure, and the gate metal material partially overlapping and directly contacting a top surface of the dual isolation structure;
   a two dimensional electron gas (2DEG) layer and a barrier layer, the 2DEG layer being in direct contact with both the barrier material and the channel material, both the 2DEG layer and the barrier material being between and in direct contact with the inner sidewalls of the dual isolation structure;
   an encapsulation layer extending over and in direct contact with a top surface of the buffer layer, the outer sidewalls and the top surface of the dual isolation structure, and further directly contacting a sidewall of the gate material adjacent to where the gate metal material partially overlaps the inner sidewalls of the dual isolation structure and directly contacts the top surface of the dual isolation structure,
   wherein the buffer layer is below and extends underneath and beyond outer edges of the outer sidewalls of the dual isolation structure and is directly contacting the underlying semiconductor material and the channel material.

2. The structure of claim 1, wherein the dual isolation structure comprises two isolation structures on a first set of opposing sides of the active device region.

3. The structure of claim 2, wherein the dual isolation structure comprises a same semiconductor material as the channel material and a barrier material on the channel material.

4. The structure of claim 2, wherein the dual isolation structure is absent on a second set of opposing sides of the active device region.

5. The structure of claim 1, wherein the doped semiconductor material comprises one of an inert gas species and a noble gas species.

6. The structure of claim 1, wherein the dual isolation structure comprises a surface coplanar with a barrier material over the channel material.

7. The structure of claim 6, wherein the non-vertical angled outer sidewalls of the dual isolation structure comprise an outer tapered, and the dual isolation structure further comprising an inner vertical sidewall, the channel material is between and in direct contact with the inner vertical sidewall, and the bottom surface of the gate metal material does not extend past the outer tapered sidewall.

8. The structure of claim 7, further comprising insulator material over the outer tapered sidewall of the dual isolation structure.

9. The structure of claim 8, further comprising an insulator liner directly contacting the outer tapered sidewall of the dual isolation structure and the underlying semiconductor material, and the insulator material being in direct contact with the insulator liner.

10. The structure of claim 1, wherein the channel material comprises GaN.

11. A structure comprising:
a buffer layer above an underlying semiconductor material;
an active device region comprising a channel material and a gate metal material, wherein a bottom surface of the channel material is over the buffer layer;
a first isolation structure of doped semiconductor material on a first side of the channel material of the active device region and located over the buffer layer, the first isolation structure comprising an outer non-vertical, angled sidewall;
a second isolation structure of the doped semiconductor material on a second, opposing side of the channel material of the active device region and located over the buffer layer, the second isolation structure comprising an outer non-vertical, angled sidewall;
a two dimensional electron gas (2DEG) layer in direct contact with the channel material and a vertical inner sidewall of the first isolation structure and the second isolation structure;
a barrier layer in direct contact with a top surface of the 2DEG layer, the vertical inner sidewalls of the first isolation structure and the second isolation structure, and an underside surface of the gate metal material; and
an encapsulation layer extending over the first and second isolation structures,
wherein the gate metal material partially overlaps a side edge of the first isolation structure and the second isolation structure and is completely over a top surface of the first isolation structure and the second isolation structure, the gate metal material being in direct contact with a top surface of the first and second isolation structures,
wherein the encapsulation layer directly contacts the gate material adjacent to the gate metal material partially overlapping the side edge and directly contacts the outer non-vertical, angled sidewall of the first and second isolation structures,
wherein the buffer layer is below and extends underneath and beyond outer edges of the dual isolation structure and is directly contacting the underlying semiconductor material and the channel material.

12. The structure of claim 11, wherein the active device region is devoid of isolation structures on a second set of opposing sidewalls.

13. The structure of claim 11, wherein the first isolation structure and the second isolation structure comprise a dual isolation structure composed of a same semiconductor material as the channel material of the active device region.

14. The structure of claim 11, wherein the dual isolation structure comprises a doped semiconductor material which has a damaged crystalline structure.

15. The structure of claim 11, wherein the first isolation structure and the second isolation structure each comprise an outer tapered sidewall comprising the non-vertical, angled sidewall, and a bottom surface of the gate metal material does not extend beyond the outer tapered sidewall of the first isolation structure and the second isolation structure.

16. The structure of claim 11, wherein the channel material comprises GaN.

17. The structure of claim 11, wherein a sidewall of the first isolation structure and a sidewall of the second isolation structure are lined with an insulator liner material.

18. The structure of claim 17, further comprising interlevel dielectric material in direct contact with the insulator liner material.

19. A method comprising:
forming a buffer layer above an underlying semiconductor material;
forming an active device region comprising a channel material and a gate metal material, wherein a bottom surface of the channel material is over the buffer layer;
forming a first isolation structure of doped semiconductor material on a first side of the channel material of the active device region and located over the buffer layer, the first isolation structure comprising an outer non-vertical, angled sidewall; and
forming a second isolation structure of the doped semiconductor material on a second, opposing side of the channel material of the active device region and located over the buffer layer, the second isolation structure comprising an outer non-vertical, angled sidewall,
forming a two dimensional electron gas (2DEG) layer and a barrier layer, the 2DEG layer being in direct contact with both the barrier material and the channel material, both the 2DEG layer and the barrier material being between and in direct contact with inner sidewalls of the first isolation structure and the second isolation structure;
an encapsulation layer extending over and in direct contact with a top surface of the buffer layer, outer sidewalls of the first isolation structure and the second isolation structure and the top surface of the dual isolation structure, and further directly contacting a sidewall of the gate material adjacent to where the gate metal material partially overlaps the inner sidewalls of the dual isolation structure and directly contacts the top surface of the dual isolation structure,
wherein the buffer layer is below and extends underneath and beyond outer edges of the outer sidewalls of the dual isolation structure and is directly contacting the underlying semiconductor material and the channel material.

\* \* \* \* \*